(12) United States Patent
Ribeiro et al.

(10) Patent No.: US 12,347,961 B2
(45) Date of Patent: Jul. 1, 2025

(54) DEAD-END PLUGS FOR SOLAR CABLES AND RELATED SYSTEMS AND METHODS

(71) Applicants: TE Connectivity Solutions GmbH, Schaffhausen (CH); Tyco Electronics Austria GmbH, Vienna (AT); TE Connectivity Nederland BV, s'Hertogenbosch (NL)

(72) Inventors: Daniel Ferreira Ribeiro, Holly Springs, NC (US); Frank Rosenkranz, Vienna (AT); Kathryn Marie Maher, Cary, NC (US); Freddy Jean Philip Dendas, s'Hertogenbosch (NL); Matthew Schuster, Garner, NC (US); Austin Draughn, Garner, NC (US)

(73) Assignee: TE CONNECTIVITY SOLUTIONS GMBH et al, Schaffhausen (CH)

( * ) Notice: Subject to any disclaimer, the term of this patent is extended or adjusted under 35 U.S.C. 154(b) by 372 days.

(21) Appl. No.: 17/848,738

(22) Filed: Jun. 24, 2022

(65) Prior Publication Data
US 2023/0023404 A1    Jan. 26, 2023

Related U.S. Application Data

(60) Provisional application No. 63/225,328, filed on Jul. 23, 2021.

(51) Int. Cl.
*H01R 13/443* (2006.01)
*H01R 13/52* (2006.01)
(Continued)

(52) U.S. Cl.
CPC ....... *H01R 13/443* (2013.01); *H01R 13/5221* (2013.01); *H01R 13/533* (2013.01); *H02S 40/36* (2014.12)

(58) Field of Classification Search
CPC ....... H02S 40/36; Y02E 10/50; H01R 13/443; H01R 13/5221; H01R 13/533
(Continued)

(56) References Cited

U.S. PATENT DOCUMENTS 4,736,100 A * 4/1988 Vastagh ............... G02B 6/4246
356/73.1
4,886,471 A * 12/1989 Fleshman, Jr. ...... H01R 13/443
439/282
(Continued)

FOREIGN PATENT DOCUMENTS

| CA | 2864933 | 8/2013 |
|---|---|---|
| CA | 3053934 | 9/2018 |
| CN | 207368291 | 5/2018 |

OTHER PUBLICATIONS

CA-2762078 original and translation (Year: 2013).*
(Continued)

*Primary Examiner* — Marcus E Harcum

(57) ABSTRACT

A system for sealing a terminated solar cable, the system including: a solar cable; a connector terminating the solar cable, the connector including a locking feature; and a plug including a locking feature. When the locking feature of the plug engages the locking feature of the connector to lock the plug and the connector in a locked state, the solar cable is sealed to provide safety from voltage and protection from dust and liquid.

15 Claims, 13 Drawing Sheets

(51) Int. Cl.
H01R 13/533 (2006.01)
H02S 40/36 (2014.01)

(58) Field of Classification Search
USPC .................................................. 439/148, 528
See application file for complete search history.

(56) References Cited

U.S. PATENT DOCUMENTS

| | | | | |
|---|---|---|---|---|
| 5,414,790 A * | 5/1995 | Lee | ...................... | G02B 6/3849 |
| | | | | 385/139 |
| 6,227,717 B1 * | 5/2001 | Ott | ...................... | G02B 6/3849 |
| | | | | 385/139 |
| 6,273,729 B1 * | 8/2001 | Kelly | .................. | B60R 16/0207 |
| | | | | 439/36 |
| 6,354,846 B1 * | 3/2002 | Murakami | ............. | H05K 3/301 |
| | | | | 439/148 |
| 6,374,030 B2 * | 4/2002 | Krow, Jr. | ............. | G02B 6/3807 |
| | | | | 385/85 |
| 6,769,813 B2 * | 8/2004 | Cheng | .................. | G02B 6/4292 |
| | | | | 385/78 |
| 7,220,137 B1 * | 5/2007 | Liu | ...................... | H01R 25/003 |
| | | | | 220/840 |
| 7,717,740 B2 * | 5/2010 | Zahnen | ................ | H01R 13/523 |
| | | | | 439/798 |
| 7,850,476 B2 * | 12/2010 | Good | ...................... | H01R 31/06 |
| | | | | 439/352 |
| 8,632,358 B2 * | 1/2014 | Leonhard | ............. | H01R 13/443 |
| | | | | 439/501 |
| 8,807,843 B2 * | 8/2014 | Gurreri | ................ | G02B 6/3831 |
| | | | | 439/680 |
| 9,799,984 B2 * | 10/2017 | Lueckemeier | ..... | H01R 13/5213 |
| 11,374,344 B2 * | 6/2022 | Yao | .................... | H01R 13/5213 |
| 2011/0104925 A1 * | 5/2011 | Quiter | ................ | H01R 13/6273 |
| | | | | 29/857 |
| 2011/0275232 A1 * | 11/2011 | Duesterhoeft | .......... | H02S 40/34 |
| | | | | 29/877 |
| 2012/0045937 A1 * | 2/2012 | Richter | ................ | H01R 9/2491 |
| | | | | 439/620.21 |
| 2012/0202374 A1 * | 8/2012 | Stracke | .............. | H01R 13/6273 |
| | | | | 439/502 |
| 2012/0205149 A1 * | 8/2012 | Lenel | ...................... | H02S 40/34 |
| | | | | 174/547 |
| 2012/0312346 A1 * | 12/2012 | Roman, Jr. | ........ | H01R 13/5808 |
| | | | | 439/271 |
| 2013/0029505 A1 * | 1/2013 | Hackett | .................. | G06F 21/85 |
| | | | | 439/135 |
| 2014/0126120 A1 * | 5/2014 | Lehtola | .................... | H05K 7/14 |
| | | | | 361/679.01 |
| 2014/0127926 A1 * | 5/2014 | Condo | ............... | H01R 13/6456 |
| | | | | 439/345 |
| 2015/0132979 A1 * | 5/2015 | Siebens | ................ | H01R 13/648 |
| | | | | 439/310 |
| 2019/0165514 A1 * | 5/2019 | Kondo | .................. | F16B 35/048 |
| 2020/0366034 A1 * | 11/2020 | Tseng | ................. | H01R 13/6591 |

OTHER PUBLICATIONS

Canadian Examination Report Canadian App. No. 3158423 Canadian Filing Date Dec. 11, 2024.
Canadian Examination Report, Canadian App. No. 3168423 Canadian Filing Date Oct. 17, 2023.
Staubi Electrical connectors AG, "Assembly instructions Sealing caps PV-BVK4", Franken Solar Americas, https://shop.frankensolar.ca/content/documentation/St%C3%A4ubli/Manual_Staubi_PV-SVK4-MA258-fr-en%20_(frankensolar).pdf, Jan. 2017.
TE Connectivity, "SOLARLOK Blindplug Assessory", https:www.te.com/usa-en/product-21202413-1.html, Feb. 2011.
TE Connectivity, "Edge Connection Appliation Specification", https://www.te.com/commerce/DocumentDelivery/DDEController?Action=showdoc&DocID=Specification+Or+Standard%7F114-18896%7FB%7Fpdf%7FEnglish%7FENG_SS_114-18896_B.pdf, Jun. 27, 2011.
TE Connectivity, "SOLARLOK Product Solutions", https://www.te.com/commerce/DocumentDelivery/DDEController?Action=srchrtrv&DocNm=1-773888-9_SolarCatalog&DocType=Type=DS&DocLang=English&DocFilenme=ENG_DS_1-1773888-9_SolarCatalog_1907.pdf.

* cited by examiner

DEAD-END PLUGS FOR SOLAR CABLES AND RELATED SYSTEMS AND METHODS

RELATED APPLICATIONS

This application claims priority from U.S. Provisional Application No. 63/225,328, filed Jul. 23, 2021, the disclosure of which is incorporated by reference in its entirety.

BACKGROUND

When solar panels are installed in series with a harness there is a voltage introduced to the open end of the completed line. In addition, the open ended connections are exposed to elements such as dust and liquid unless they are sealed correctly.

SUMMARY

Some embodiments of the present invention are directed to a system for sealing a terminated solar cable, the system including: a solar cable; a connector terminating the solar cable, the connector including a locking feature; and a plug including a locking feature. When the locking feature of the plug engages the locking feature of the connector to lock the plug and the connector in a locked state, the solar cable is sealed to provide safety from voltage and protection from dust and liquid.

In some embodiments, the connector and the plug each include a body, the body of one of the connector and the plug includes first and second arms each with a latch at an end thereof, the body of the other one of the connector and the plug includes first and second slots, and the plug and the connector are in the locked state when the first and second latches are received in the first and second slots.

In some embodiments, the body of the plug includes an elongated pin with the first and second arms on opposite sides of the pin, the body of the connector includes a socket with first and second channels on opposite sides of the socket, the first slot communicates with the first channel and resides radially outwardly of the first channel, the second slot communicates with the second channel and resides radially outwardly of the second channel, and the pin is received in the socket in the locked state.

In some embodiments, the body of the plug includes a first end portion, an opposite second end portion, and a central portion between the first and second end portions, the pin extends from the central portion to the first end portion, the first and second arms extend from the central portion toward the first end portion, and the second end portion comprises an aperture configured to receive a Lockout/Tagout (LOTO) indicator.

In some embodiments, the body of the connector includes a first end portion and an opposite second end portion, the socket is at the first end portion, and a channel configured to receive the solar cable is at the second end portion.

In some embodiments, the plug includes a first opening that communicates with the first slot and extends to an outer surface of the body of the plug, the plug includes a second opening that communicates with the second slot and extends to the outer surface of the body of the plug, the system includes a tool including a body and first and second prongs extending from the body, and the first and second prongs are configured to be received in the first and second openings to manipulate the first and second latches such that the plug and the connector can be unlocked from the locked state.

In some embodiments, the body of the plug includes a socket with first and second channels on opposite sides of the socket, the body of the connector includes an elongated pin with the first and second arms on opposite sides of the pin, the first slot communicating with the first channel and residing radially outwardly of the first channel, the second slot communicating with the second channel and residing radially outwardly of the second channel, and the pin is received in the socket in the locked state.

In some embodiments, the body of the plug includes a first end portion, an opposite second end portion, and a central portion between the first and second end portions, the socket extends from the first end portion to the central portion, the first and second channels extend from the first end portion toward the central portion, and the second end portion comprises an aperture configured to receive a Lockout/Tagout (LOTO) indicator.

In some embodiments, the body of the connector includes a first end portion and an opposite second end portion, the pin is at the first end portion, and a channel configured to receive the solar cable is at the second end portion.

In some embodiments, the connector includes a first opening that communicates with the first slot and extends to an outer surface of the body of the connector, the connector includes a second opening that communicates with the second slot and extends to the outer surface of the body of the connector, the system includes a tool comprising a body and first and second prongs extending from the body, and the first and second prongs are configured to be received in the first and second openings to manipulate the first and second latches such that the plug and the connector can be unlocked from the locked state.

In some embodiments, the solar cable is a 2 kV photovoltaic (PV) solar cable.

Some other embodiments of the present invention are directed to a method for sealing a terminated solar cable, the method including: terminating a solar cable in a connector; receiving a pin of one of a plug and the connector in a socket of the other one of the plug and the connector; receiving first and second arms of the one of the plug and the connector in first and second channels of the other one of the plug and the connector; and urging the plug and the connector together until first and second latches on the first and second arms are received in first and second slots that communicate with the first and second channels, respectively.

In some embodiments, the plug or the connector that includes the first and second slots further includes first and second openings in communication with the first and second slots, respectively, and that each extend to an outer surface of the body of the plug or the connector, and the method further includes inserting first and second prongs of a tool into the first and second openings to manipulate the first and second latches and concurrently urging the plug and the connector away from one another to unlock the plug and the connector.

In some embodiments, the method further includes applying a LOTO indicator to a tab of the plug after the urging step.

Some other embodiments of the present invention are directed to a system for sealing a terminated solar cable, the system including: a connector configured to receive a terminated solar cable, the connector including a locking feature; and a plug including a locking feature. When the locking feature of the plug engages the locking feature of the connector to lock the plug and the connector in a locked state, the solar cable is sealed to provide safety from voltage and protection from dust and liquid.

Further features, advantages and details of the present invention will be appreciated by those of ordinary skill in the art from a reading of the figures and the detailed description of the preferred embodiments that follow, such description being merely illustrative of the present invention.

DETAILED DESCRIPTION

When solar panels are installed in series with a harness there is a voltage introduced to the open end of the completed line. The current solution is tying a bag over the open end or covering the end with electrical tape. There is currently not an option on the market that protects the user from the voltage with a lockout/tagout (LOTO) procedure.

In addition, the open ended connections are exposed to elements such as dust and liquid. The current solution is to cover the open end with a dust cap. However, dust caps are not practical due to the possibility of them falling off as there is no securing feature on the dust cap.

Embodiments of the present invention provide dead-end plugs for solar cable applications that protect the user from voltage with a LOTO procedure. The plugs according to some embodiments require a special tool to open the connection and remove the plug.

Embodiments of the present invention provide plugs for solar cables and associated connectors that provide protection from elements that can harm the cable or connector. The plugs according to some embodiments provide IP68 protection (submersion in 1 m of water for 24 hours).

In addition to the open end of harnesses, plugs according to embodiments of the present invention can be mounted to make a real tight connection including at stand-alone panels, inverters (standard and micro), and combiner boxes.

Figure 1:
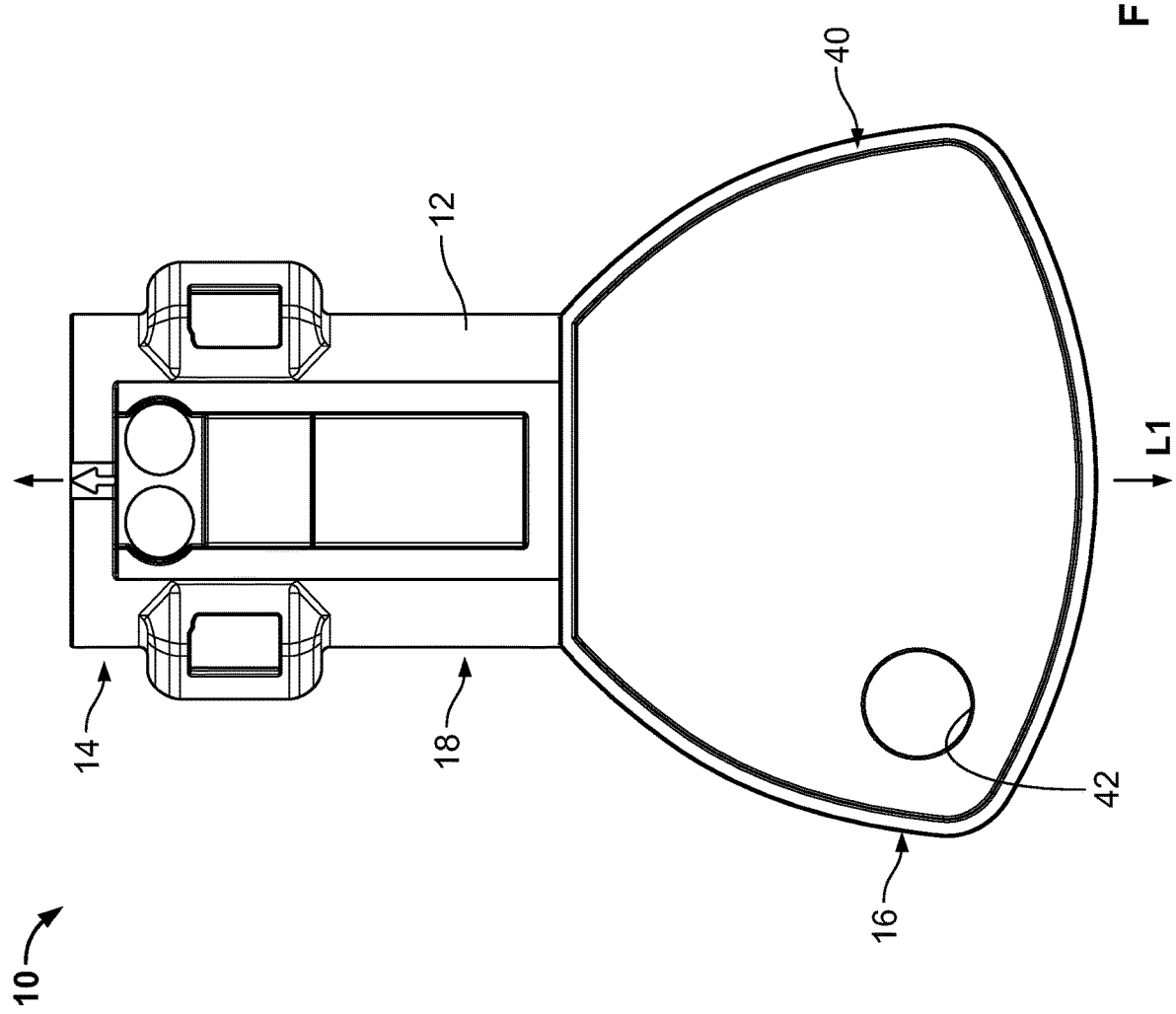
FIG. 1 is a side view of a dead-end plug according to some embodiments of the present invention.
Figure 2:
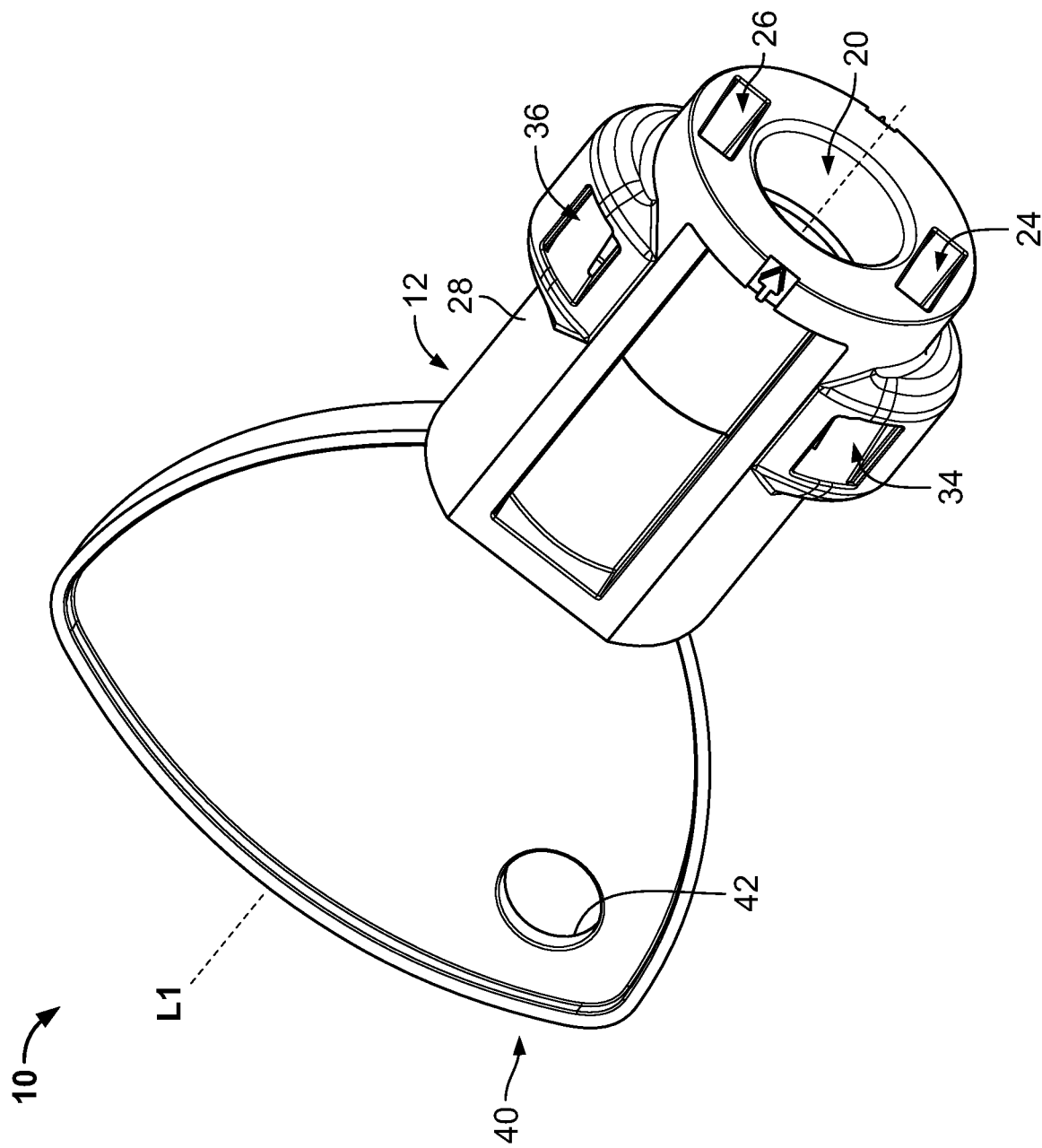
FIG. 2 is a perspective view of the plug of FIG. 1.
Figure 3:
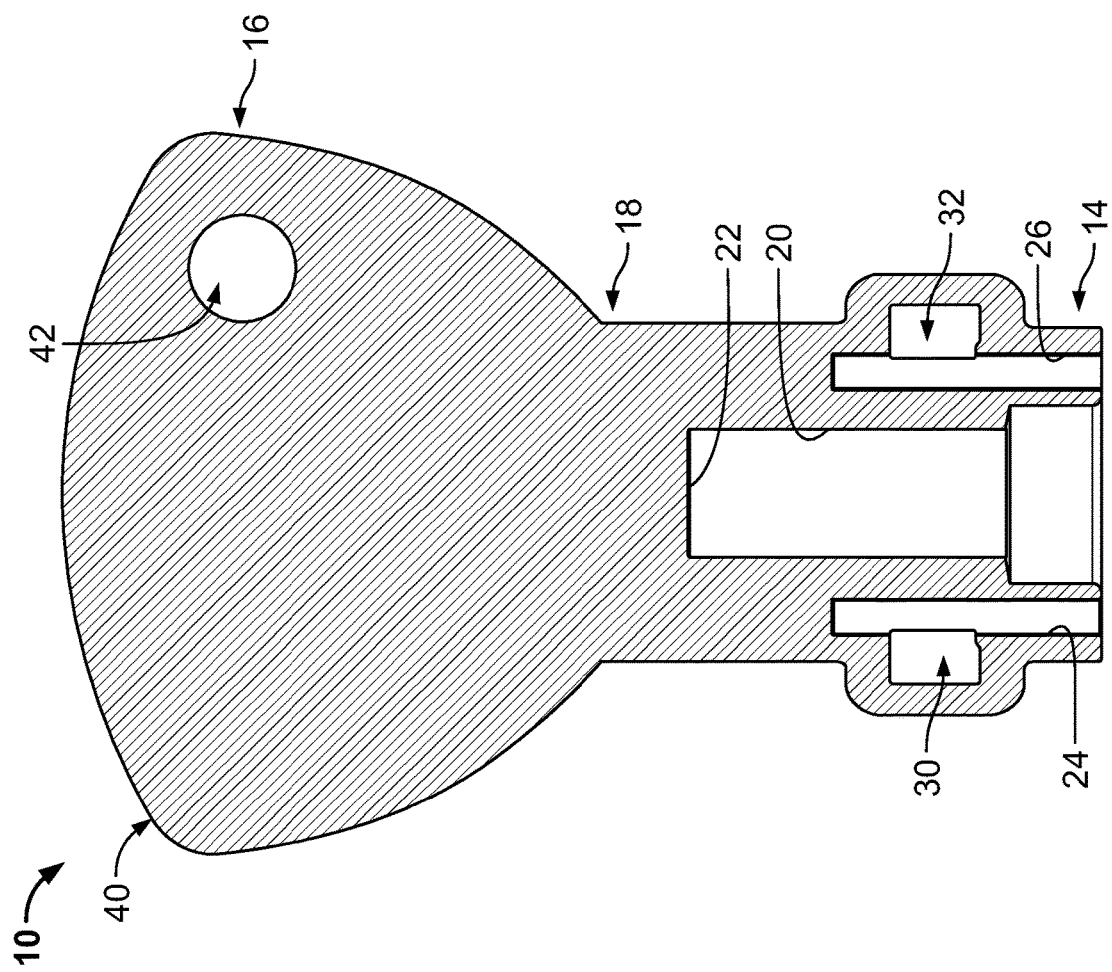
FIG. 3 is a sectional view of the plug of FIG. 1.

A dead-end plug 10 according to some embodiments is illustrated in FIGS. 1-3. The plug 10 has a body 12. The plug 10 defines a longitudinal axis L1. The body 12 of the plug 10 has a first end portion 14, an opposite second end portion 16, and a central portion 18 between the first end portion 14 and the second end portion 16.

The plug 10 includes a socket 20 extending from the first end portion 14 of the body 12 to the central portion 18 of the body 12 along the longitudinal axis L1. The socket 20 has a closed terminal end 22 at the central portion 18 of the body 12. The plug 10 includes first and second channels 24, 26 on opposite sides (e.g., diametrically opposite sides) of the socket 20. The channels 24, 26 extend from the first end portion 14 of the body 12 toward the central portion 18 of the body 12 parallel to the longitudinal axis L1. The socket 20 and the channels 24, 26 are within the body 12 (i.e., they do not extend radially to an outer surface 28 of the body).

The plug 10 includes first and second slots 30, 32 at the first end portion 14 of the body 12. The first slot 30 is in communication with the first channel 24 and resides radially outwardly from the first channel 24. The second slot 32 is in communication with the second channel 26 and resides radially outwardly from the second channel 26.

The plug 10 includes first and second openings 34, 36 that extend to the outer surface 28 of the body 12. The first opening 34 is in communication with the first slot 30 and the second opening 36 is in communication with the second slot 32.

The plug 10 includes a tab 40 extending from the central portion 18 of the body 12 to the second end portion 16 of the body 12. The tab 40 may be fan-shaped (e.g., widen from the central portion of the body 12 toward the second end portion 16 of the body 12) for ergonomic handling of the plug 10. An aperture 42 may be defined in the tab 40. A LOTO tag can be received in the aperture 42.

The body 12 of the plug 10 may be formed of any suitable material. In some embodiments, the body 12 of the plug 10 is polymeric. In some embodiments, the body 12 of the plug 10 is monolithic.

Figure 4:
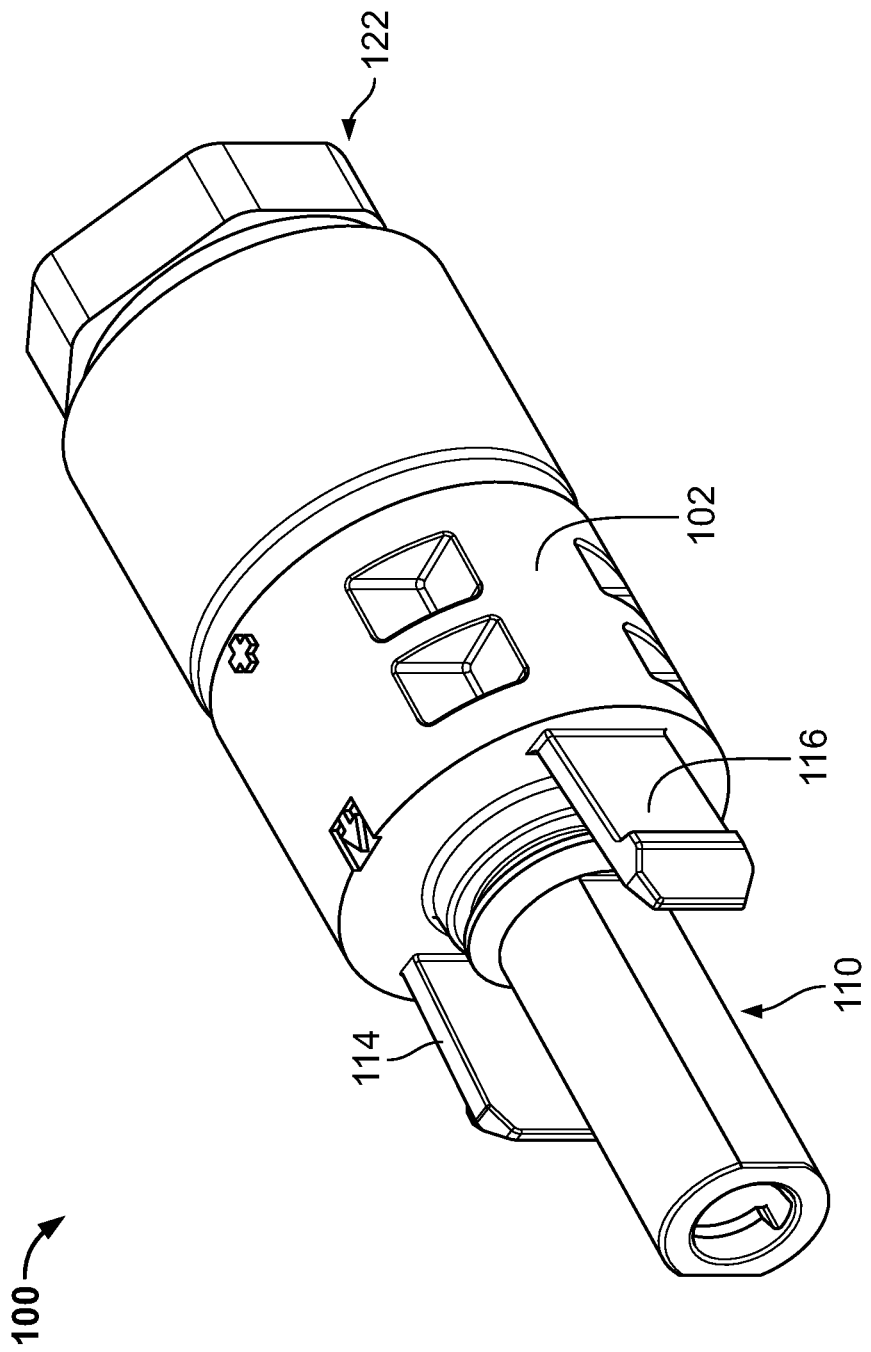
FIG. 4 is a perspective view of a cable connector according to some embodiments of the present invention.
Figure 5:
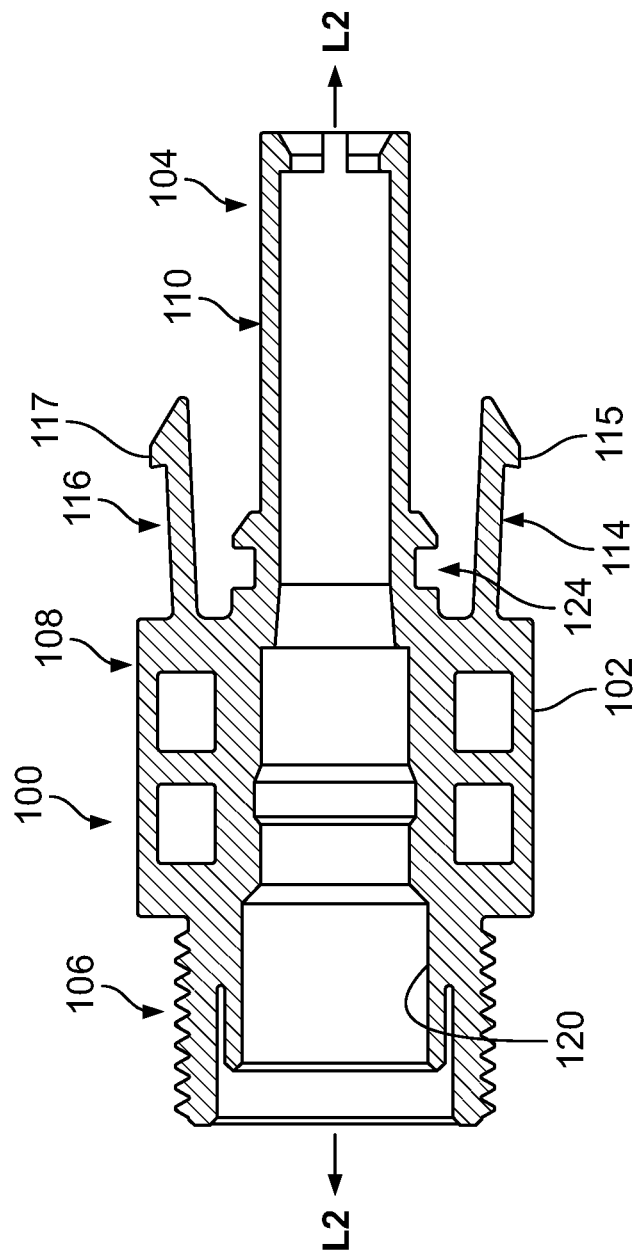
FIG. 5 is a sectional view of the connector of FIG. 4.

The plug 10 is configured to connect with and lock to a cable connector 100 shown in FIGS. 4 and 5. The connector 100 includes a body 102. The connector 100 defines a longitudinal axis L2. The body 102 of the connector 100 has a first end portion 104, an opposite second end portion 106, and a central portion 108 between the first end portion 104 and the second end portion 106.

The connector 100 includes a pin 110 extending from the central portion 108 of the body 102 to the first end portion 104 of the body 102 along the longitudinal axis L2. The connector 100 includes first and second arms 114, 116 on opposite sides (e.g., diametrically opposite sides) of the pin 110. The arms 114, 116 extend from the central portion 108 of the body 102 toward the first end portion 104 of the body 102.

A first latch 115 is at a free end of the first arm 114 (e.g., the end of the arm spaced apart from the central portion 108 of the body 102). The first latch 115 extends radially outwardly from the first arm 114. A second latch 117 is at a free end of the second arm 116 (e.g., the end of the arm spaced apart from the central portion 108 of the body 102). The second latch 117 extends radially outwardly from the second arm 116.

The first and second arms 114, 116 may be resilient. The first and second arms 114, 116 may be biased radially outwardly (e.g., away from the longitudinal axis L2).

The connector 100 includes a channel 120 at the second end portion 106 of the body 102. The channel 120 is configured to receive a solar cable as described in more detail below. The connector 100 may include a nut 122 threadingly engaged to the second end portion 106 of the body 102. For example, the nut 122 may be tightened such that the second end portion 106 of the body 102 bears down on the cable.

An annular groove 124 may surround the pin 110 adjacent the central portion 108 of the body 102. A seal such as an o-ring may be received in the groove 124 to help prevent contaminants from damaging the cable and/or connector.

The body 102 of the connector 100 may be formed of any suitable material. In some embodiments, the body 102 of the connector 100 is polymeric. In some embodiments, the body 102 of the connector 100 is monolithic.

Figure 6:
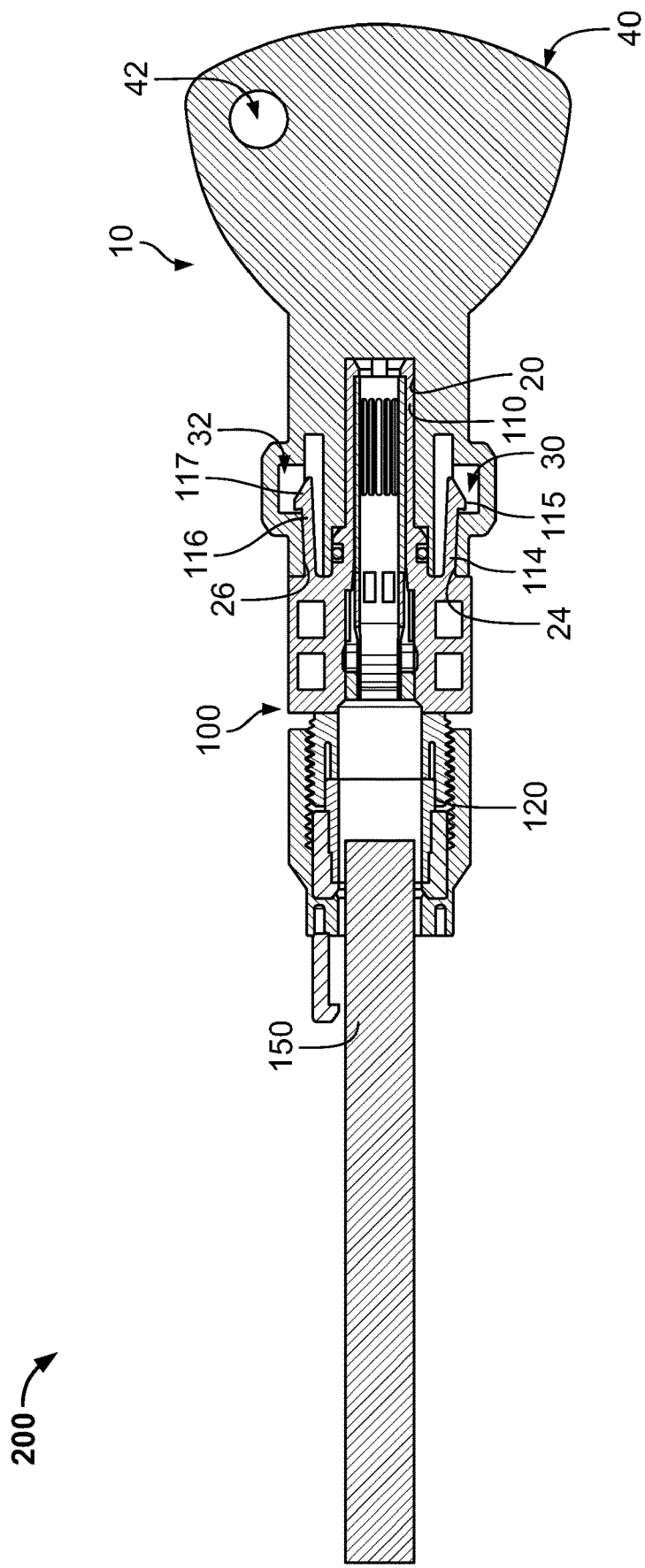
FIG. 6 is a sectional view of a system including a cable, the plug of FIG. 1, and the connector of FIG. 4 showing the connector and the plug connected in a locked state.

FIG. 6 illustrates a system 200 for sealing a terminated solar cable. The system 200 includes a solar cable 150, the plug 10, and the connector 100. In some embodiments, the solar cable is a 2 kV photovoltaic (PV) solar cable. The cable 150 is received in the channel 120 of the connector 100. The plug 10 and the connector 100 are connected and in a locked state. Specifically, the pin 110 of the connector 100 is received in the socket 20 of the plug 10. The first and second arms 114, 116 of the connector 100 are received in the first and second channels 24, 26 of the plug 10, respectively. The first and second latches 115, 117 of the connector are received in the first and second slots 30, 32 of the plug 10, respectively.

The installer may connect the plug 10 and the connector 100 by inserting the pin 110 of the connector in the socket 20 of the plug and the first and second arms 114, 116 of the connector 100 in the first and second channels 24, 26 of the plug 10. The connector 100 and the plug 10 may be urged together until the first and second latches 115, 117 of the connector 100 reach the first and second slots 30, 32 of the plug 10. The resilient arms 114, 116 of the connector may then "snap" radially outwardly such that the latches 115, 117 are held in the slots 30, 32 and the plug 10 and the connector 100 are interlocked or in a locked state. The "snapping" of the latches may provide audible and/or tactile feedback to the installer that the plug 10 and the connector 100 are in the locked state.

In the locked state, the plug 10 effectively seals the connector 100 and the cable 150. In the locked state, the installer or other user is protected from the voltage of the cable 150. The installer can then place a LOTO indicator using, for example, the aperture 42 of the plug 10. The prominent tab 40 may also provide visual evidence that the connector 100 and the cable 150 are locked out and tagged out. Also in the locked state, the connector 100 and the cable 150 are protected from elements such as dust and liquid.

Figure 13:
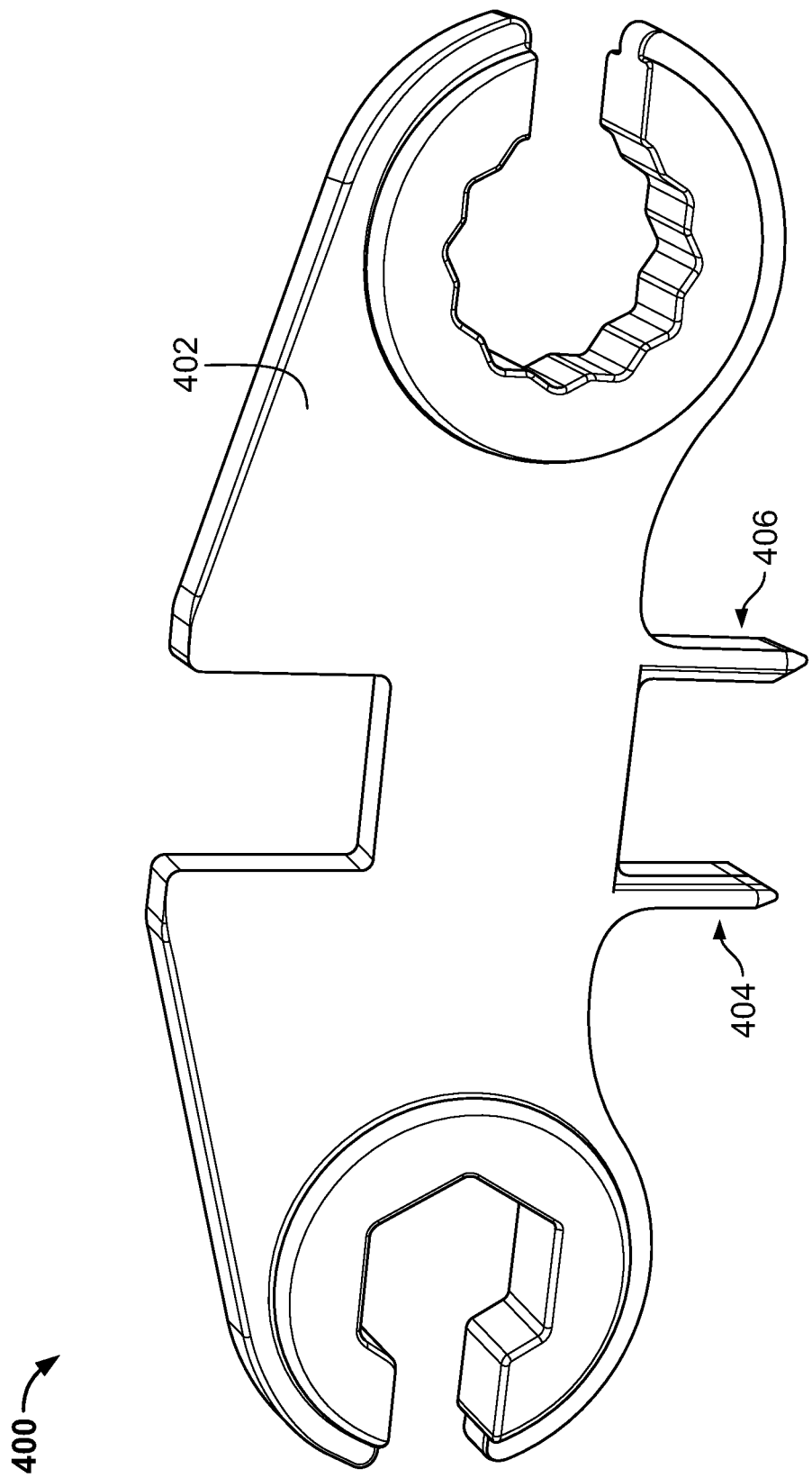
FIG. 13 is a perspective view of a tool that can be used to unlock the connector and plug in the system of FIG. 6 or FIG. 12 according to some embodiments of the present invention.

Referring to FIG. 13, a special tool 400 may be required to disconnect the plug 10 and the connector 100 from the locked state. The tool 400 may include a body 402 and first and second prongs 404, 406 extending from the body 402. The user may insert the prongs 404, 406 into the openings 34, 36 of the plug 10 (FIG. 2) to manipulate the latches 115, 117 and concurrently pull the plug 10 and/or the connector 100 away from one another to disconnect the plug 10 and the connector. The requirement of the tool 400 to disconnect the plug 10 and the connector 100 may provide safety for inexperienced users.

Figure 7:
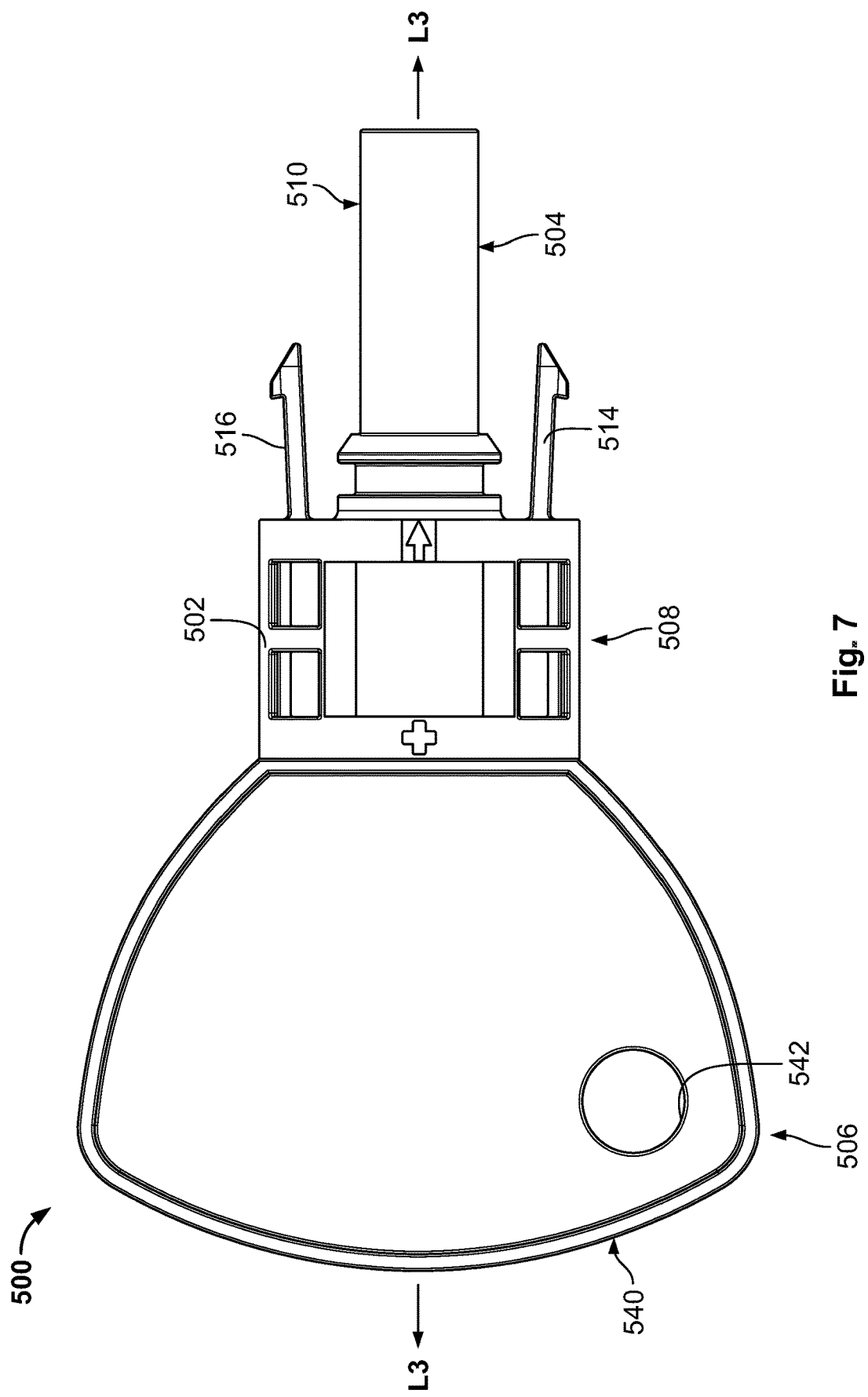
FIG. 7 is a side view of a dead-end plug according to some other embodiments of the present invention.
Figure 8:
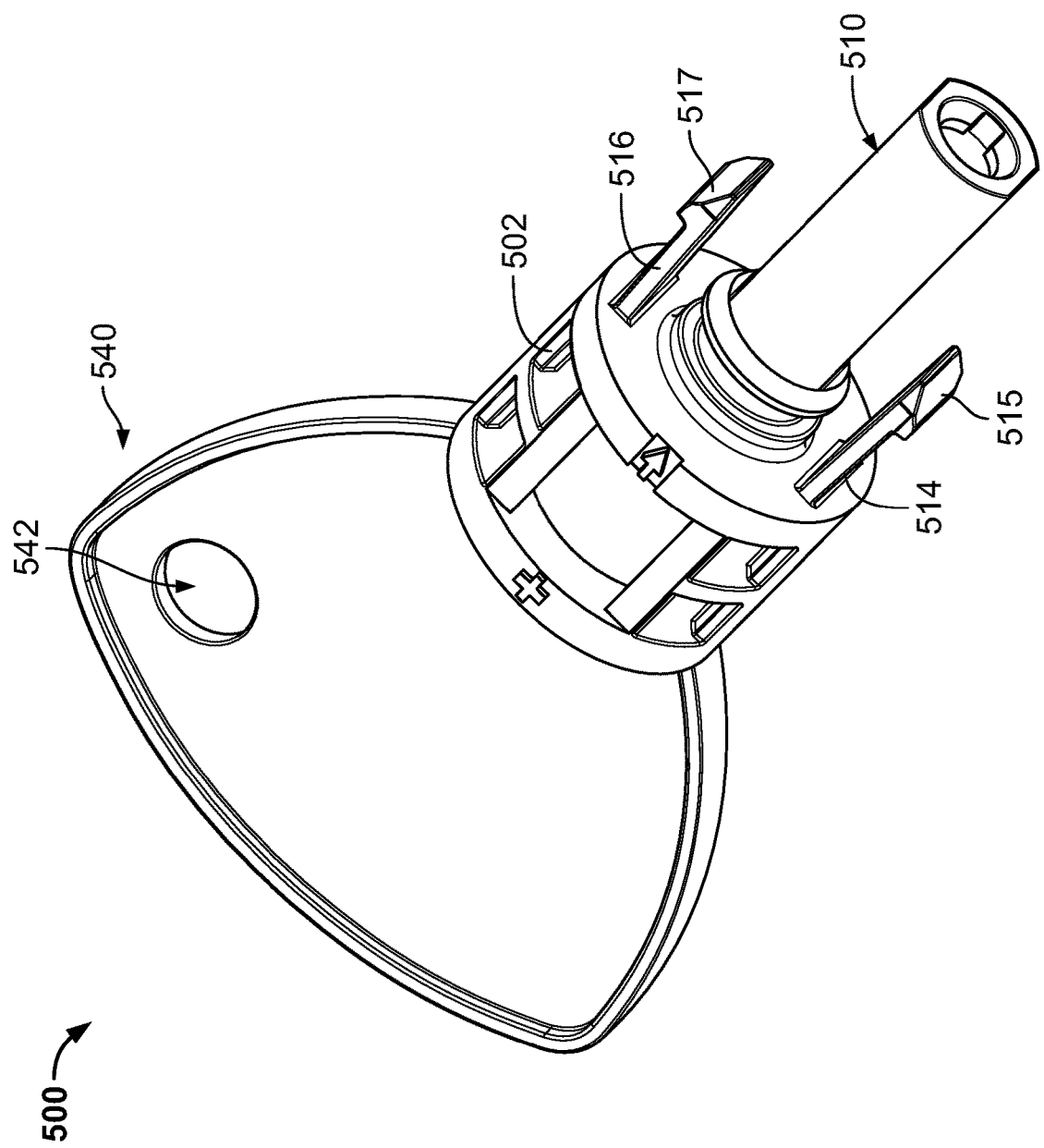
FIG. 8 is a perspective view of the plug of FIG. 7.
Figure 9:
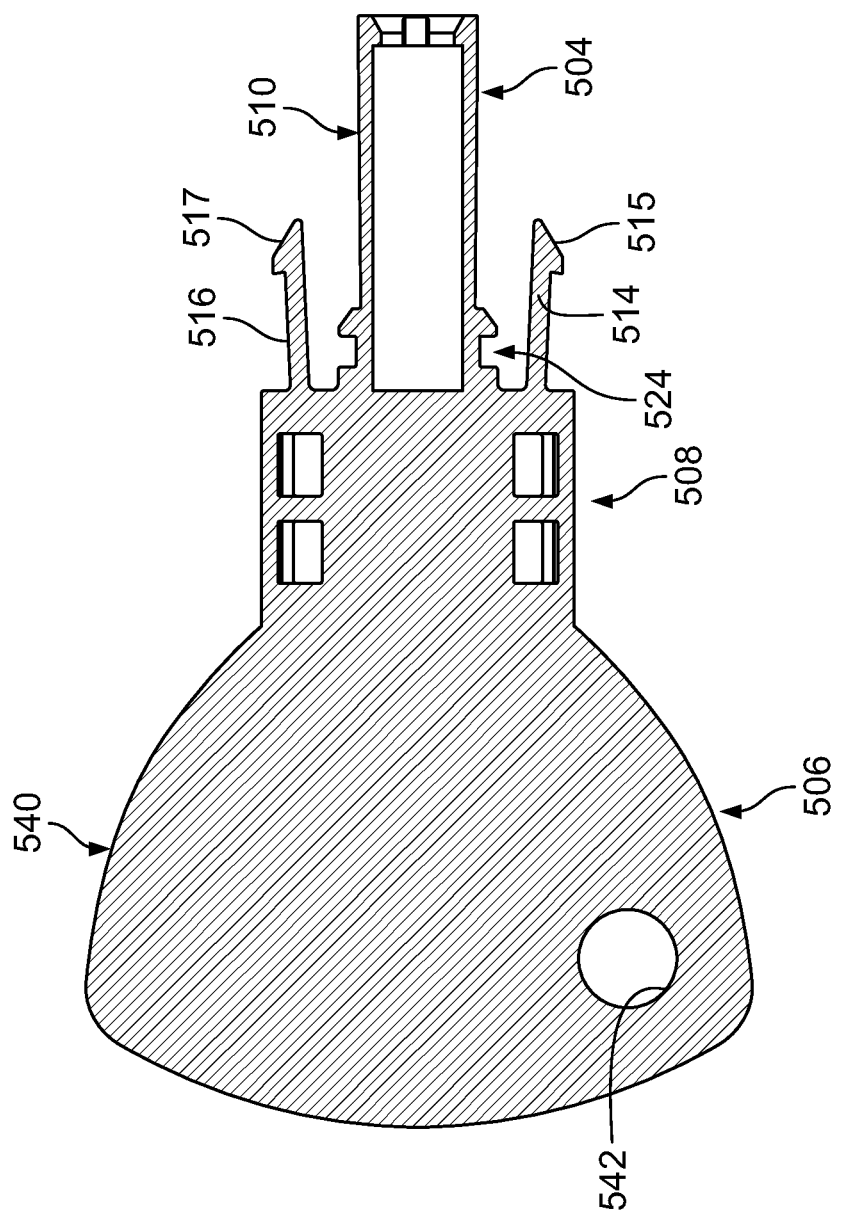
FIG. 9 is a sectional view of the plug of FIG. 7.

A dead-end plug 500 according to some other embodiments is illustrated in FIGS. 7-9. The plug 500 has a body 502. The plug 500 defines a longitudinal axis L3. The body 502 of the plug 500 has a first end portion 504, an opposite second end portion 506, and a central portion 508 between the first end portion 504 and the second end portion 506.

The plug 500 includes a pin 510 extending from the central portion 508 of the body 502 to the first end portion 504 of the body 502 along the longitudinal axis L3. The plug 500 includes first and second arms 514, 516 on opposite sides (e.g., diametrically opposite sides) of the pin 510. The arms 514, 516 extend from the central portion 508 of the body 502 toward the first end portion 504 of the body 502.

A first latch 515 is at a free end of the first arm 514 (e.g., the end of the arm spaced apart from the central portion 508 of the body 502). The first latch 515 extends radially outwardly from the first arm 514. A second latch 517 is at a free end of the second arm 516 (e.g., the end of the arm spaced apart from the central portion 508 of the body 502). The second latch 517 extends radially outwardly from the second arm 516.

The first and second arms 514, 516 may be resilient. The first and second arms 514, 516 may be biased radially outwardly (e.g., away from the longitudinal axis L3).

The plug 500 includes a tab 540 extending from the central portion 508 of the body 502 to the second end portion 506 of the body 502. The tab 540 may be fan-shaped (e.g., widen from the central portion 508 of the body 502 toward the second end portion 506 of the body 502) for ergonomic handling of the plug 500. An aperture 542 may be defined in the tab 540. A LOTO tag can be received in the aperture 542.

An annular groove 524 may surround the pin 510 adjacent the central portion 508 of the body 502. A seal such as an o-ring may be received in the groove 524 to help prevent contaminants from damaging the cable and/or connector.

The body 502 of the plug 500 may be formed of any suitable material. In some embodiments, the body 502 of the plug 500 is polymeric. In some embodiments, the body 502 of the plug 500 is monolithic.

Figure 10:
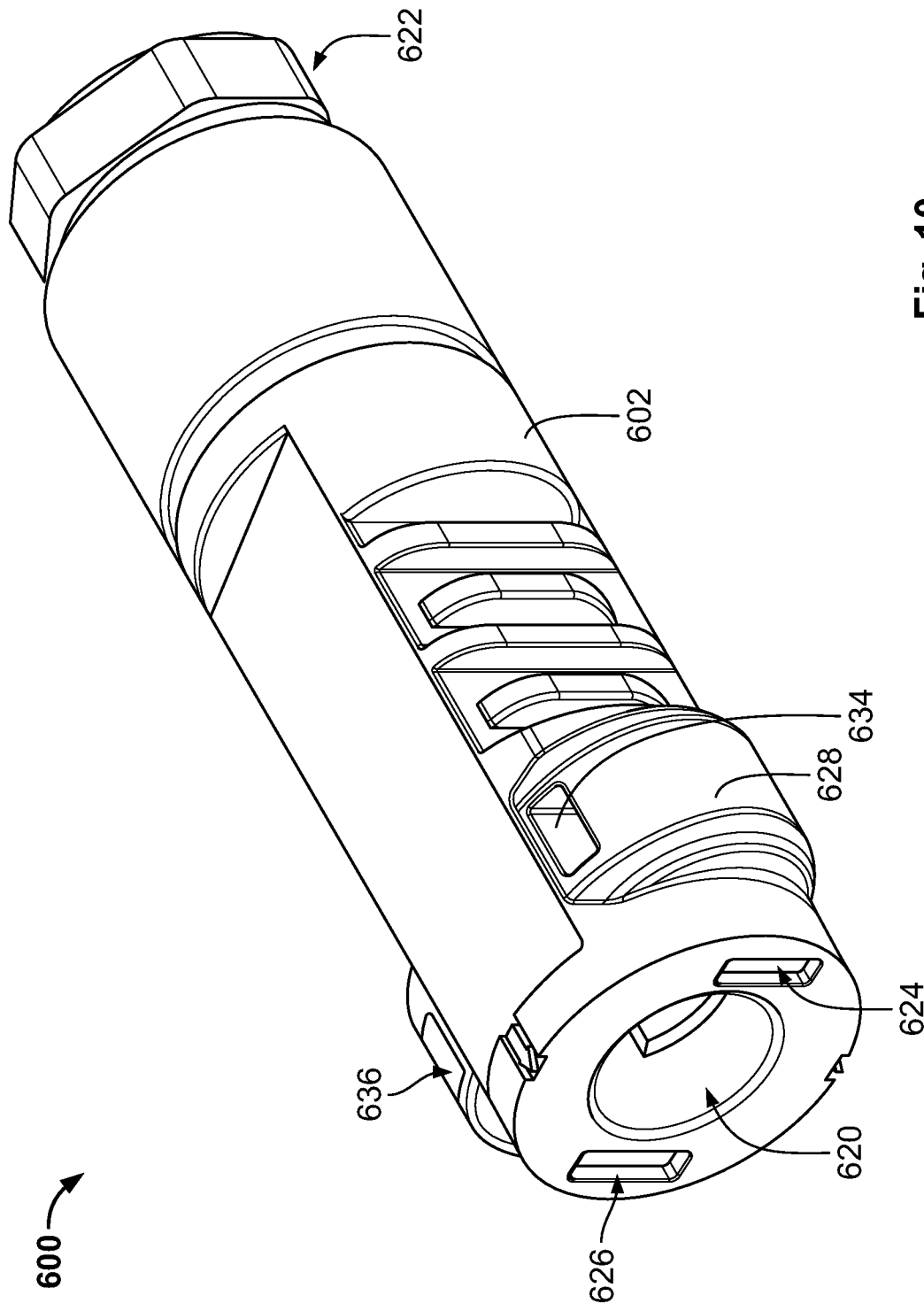
FIG. 10 is a perspective view of a cable connector according to some other embodiments of the present invention.
Figure 11:
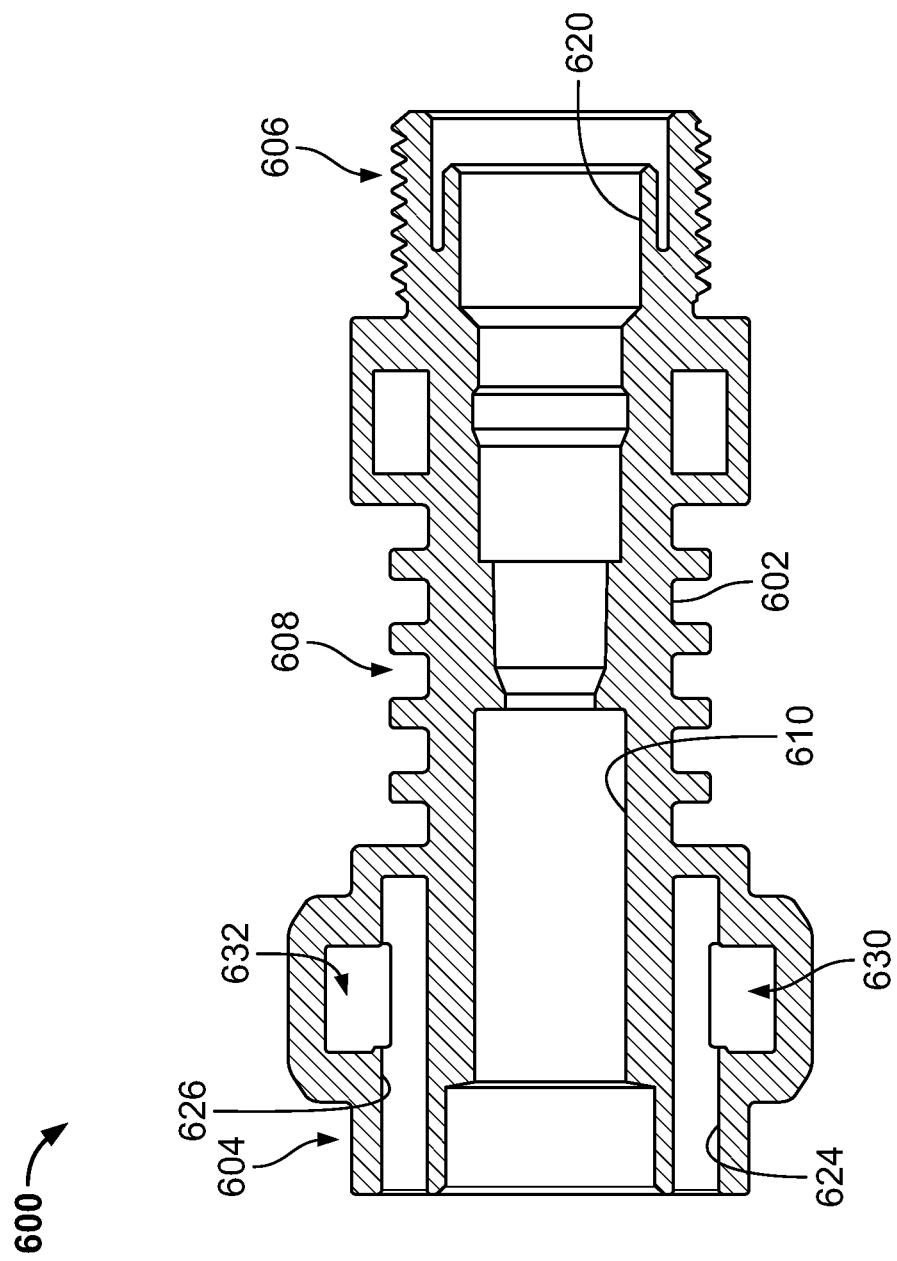
FIG. 11 is a sectional view of the connector of FIG. 10.

The plug 500 is configured to connect with and lock to a cable connector 600 shown in FIGS. 10 and 11. The connector 600 includes a body 602. The connector 600 defines a longitudinal axis L4. The body 602 of the connector 600 has a first end portion 604, an opposite second end portion 606, and a central portion 608 between the first end portion 604 and the second end portion 606.

The connector 600 includes a socket 620 extending from the first end portion 604 of the body 602 to the central portion 608 of the body 602 along the longitudinal axis L4. The connector 600 includes first and second channels 624, 626 on opposite sides (e.g., diametrically opposite sides) of the socket 620. The channels 624, 626 extend from the first end portion 604 of the body 602 toward the central portion 608 of the body 602 parallel to the longitudinal axis L4. The socket 620 and the channels 624, 626 are within the body 602 (i.e., they do not extend to an outer surface 628 of the body 602).

The connector 600 includes first and second slots 630, 632 at the first end portion 604 of the body 602. The first slot 630 is in communication with the first channel 624 and resides radially outwardly from the first channel 624. The second slot 632 is in communication with the second channel 626 and resides radially outwardly from the second channel 626.

The connector 600 includes first and second openings 634, 636 that extend to the outer surface 628 of the body 602. The first opening 634 is in communication with the first slot 630 and the second opening 636 is in communication with the second slot 632.

The connector 600 includes a channel 620 at the second end portion 606 of the body 602. The channel 620 is configured to receive a solar cable as described in more detail below. The connector 600 may include a nut 622 threadingly engaged to the second end portion 606 of the body 602. For example, the nut 622 may be tightened such that the second end portion 606 of the body 602 bears down on the cable.

The body 602 of the connector 600 may be formed of any suitable material. In some embodiments, the body 602 of the connector 600 is polymeric. In some embodiments, the body 602 of the connector 600 is monolithic.

Figure 12:
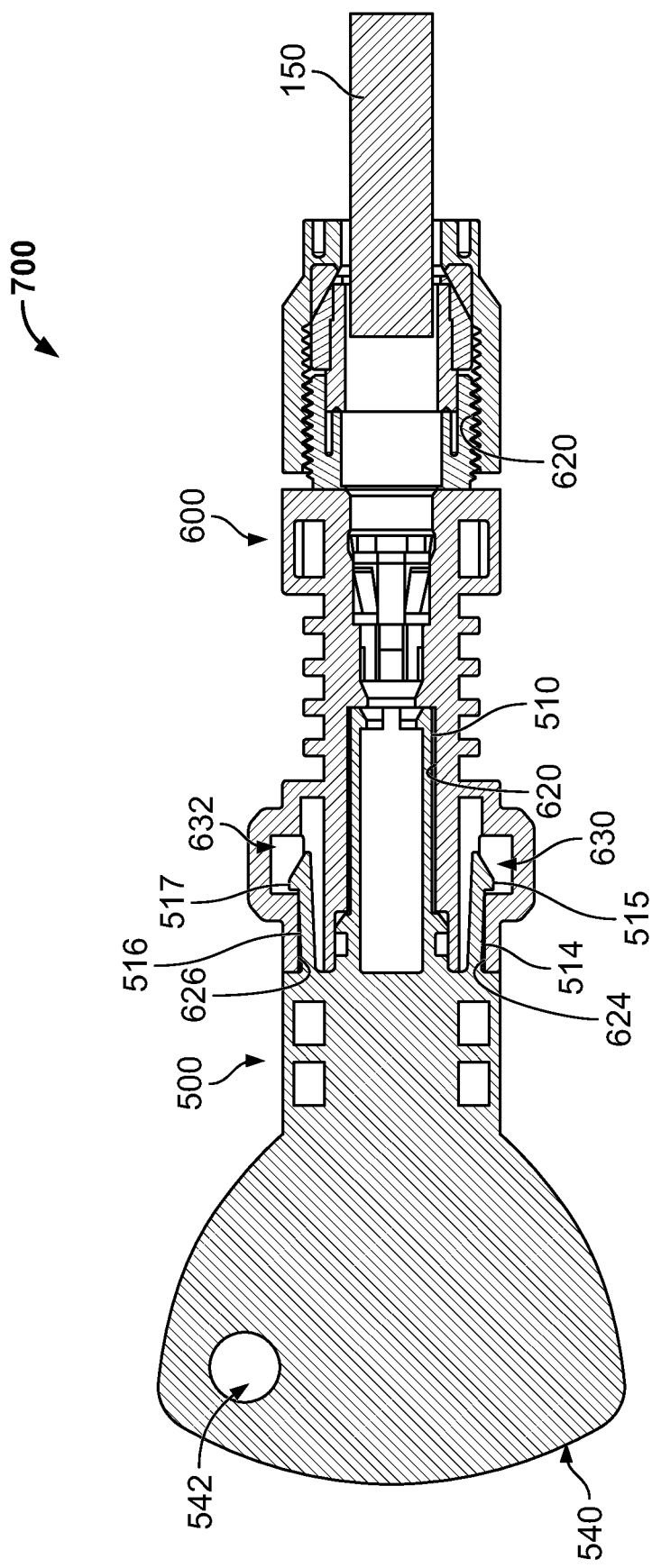
FIG. 12 is a sectional view of a system including a cable, the plug of FIG. 7, and the connector of FIG. 10 showing the connector and the plug connected in a locked state.

FIG. 12 illustrates a system 700 for sealing a terminated solar cable. The system 700 includes a solar cable 150, the plug 500, and the connector 600. The cable 150 is received in the channel 620 of the connector 600. The plug 500 and the connector 600 are connected and in a locked state. Specifically, the pin 510 of the plug 500 is received in the socket 620 of the connector 600. The first and second arms 514, 516 of the plug 500 are received in the first and second channels 624, 626 of the connector 600, respectively. The first and second latches 515, 517 of the plug 500 are received in the first and second slots 630, 632 of the connector 600, respectively.

The installer may connect the plug 500 and the connector 600 by inserting the pin 510 of the plug 500 in the socket 620 of the connector 600 and the first and second arms 514, 516 of the plug 500 in the first and second channels 624, 626 of the connector 600. The connector 600 and the plug 500 may be urged together until the first and second latches 515, 517 of the plug 500 reach the first and second slots 630, 632 of the connector 600. The resilient arms 514, 516 of the plug 500 may then "snap" radially outwardly such that the latches 515, 517 are held in the slots 630, 632 and the plug 500 and the connector 600 are in a locked state. The "snapping" of the latches may provide audible and/or tactile feedback to the installer that the plug 500 and the connector 600 are in the locked state.

In the locked state, the plug 500 effectively seals the connector 600 and the cable 150. In the locked state, the installer or other user is protected from the voltage of the cable 150. The installer can then place a LOTO indicator using, for example, the aperture 542 of the plug 500. The prominent tab 540 may also provide visual evidence that the connector 600 and the cable 150 are locked out and tagged out. Also in the locked state, the connector 600 and the cable 150 are protected from elements such as dust and liquid.

Referring to FIG. 13, the special tool 400 may be required to disconnect the plug 500 and the connector 600 from the locked state. The user may insert the prongs 404, 406 into the openings 634, 636 of the connector (FIG. 10) to manipulate the latches 515, 517 and concurrently pull the plug 500 and/or the connector 600 away from one another to disconnect the plug 500 and the connector 600. The requirement of the tool 400 to disconnect the plug 500 and the connector 600 may provide safety for inexperienced users.

The present invention has been described herein with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90° or at other orientations) and the spatially relative descriptors used herein interpreted accordingly.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items. When the term "about" or "substantially equal to" is used in the specification the intended meaning is that the value is plus or minus 5% of the specified value.

It is noted that any one or more aspects or features described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The foregoing is illustrative of the present invention and is not to be construed as limiting thereof. Although a few example embodiments of this invention have been described, those skilled in the art will readily appreciate that many modifications are possible in the example embodiments without materially departing from the teachings and advantages of this invention. Accordingly, all such modifications are intended to be included within the scope of this invention as defined in the claims. The invention is defined by the following claims, with equivalents of the claims to be included therein.

What is claimed is:

1. A system for sealing a terminated solar cable, the system comprising:
    a connector configured to receive a terminal end of a solar cable, the connector comprising a locking feature; and
    a plug comprising a locking feature,
    wherein, when the locking feature of the plug engages the locking feature of the connector to lock the plug and the connector in a locked state, the solar cable is sealed to provide safety from voltage and protection from dust and liquid,
    wherein the plug comprises a body comprising a first end portion, an opposite second end portion, and a central portion between the first and second end portions,
    wherein the locking feature of the plug is at the central portion of the body and/or the first end portion of the body,
    wherein the plug comprises a tab extending from the central portion of the body to the second end portion of the body, and
    wherein the tab widens from the central portion of the body toward the second end portion of the body.

2. The system of claim 1, wherein the connector comprises a body, the body of one of the connector and the plug comprises first and second arms each with a latch at an end thereof, the body of the other one of the connector and the plug comprises first and second slots, and the plug and the connector are in the locked state when the first and second latches are received in the first and second slots.

3. The system of claim 2, wherein the body of the plug comprises an elongated pin with the first and second arms on opposite sides of the pin, the body of the connector comprises a socket with first and second channels on opposite sides of the socket, the first slot communicates with the first channel and resides radially outwardly of the first channel, the second slot communicates with the second channel and resides radially outwardly of the second channel, and the pin is received in the socket in the locked state.

4. The system of claim 3, wherein the pin extends from the central portion to the first end portion of the body of the plug, the first and second arms extend from the central portion toward the first end portion of the body of the plug, and the second end portion of the body of the plug comprises an aperture configured to receive a Lockout/Tagout (LOTO) indicator.

5. The system of claim 3, wherein the body of the connector comprises a first end portion and an opposite second end portion, the socket is at the first end portion, and a channel configured to receive the solar cable is at the second end portion.

6. The system of claim 3, wherein the connector comprises a first opening that communicates with the first slot and extends to an outer surface of the body of the connector, the connector comprises a second opening that communicates with the second slot and extends to the outer surface of the body of the connector, the system comprises a tool comprising a body and first and second prongs extending from the body, and the first and second prongs are configured to be received in the first and second openings to manipulate the first and second latches such that the plug and the connector can be unlocked from the locked state.

7. The system of claim 2, wherein the body of the plug comprises a socket with first and second channels on opposite sides of the socket, the body of the connector comprises an elongated pin with the first and second arms on opposite sides of the pin, the first slot communicating with the first channel and residing radially outwardly of the first channel, the second slot communicating with the second channel and residing radially outwardly of the second channel, and the pin is received in the socket in the locked state.

8. The system of claim 7, wherein the socket extends from the first end portion to the central portion of the body of the plug, the first and second channels extend from the first end portion toward the central portion of the body of the plug, and the second end portion of the body of the plug comprises an aperture configured to receive a Lockout/Tagout (LOTO) indicator.

9. The system of claim 7, wherein the body of the connector comprises a first end portion and an opposite second end portion, the pin is at the first end portion, and a channel configured to receive the solar cable is at the second end portion.

10. The system of claim 7, wherein the plug comprises a first opening that communicates with the first slot and extends to an outer surface of the body of the plug, the plug comprises a second opening that communicates with the second slot and extends to the outer surface of the body of the plug, the system comprises a tool comprising a body and first and second prongs extending from the body, and the first and second prongs are configured to be received in the first and second openings to manipulate the first and second latches such that the plug and the connector can be unlocked from the locked state.

11. The system of claim 1, further comprising a solar cable.

12. The system of claim 11, wherein the solar cable is a 2 kV photovoltaic (PV) solar cable.

13. A method for sealing a terminated solar cable, the method comprising:
    terminating a solar cable in a connector;
    receiving a pin of one of a plug and the connector in a socket of the other one of the plug and the connector;
    receiving first and second arms of the one of the plug and the connector in first and second channels of the other one of the plug and the connector; and
    urging the plug and the connector together until first and second latches on the first and second arms are received in first and second slots that communicate with the first and second channels, respectively,
    wherein the plug comprises a body comprising a first end portion, an opposite second end portion, and a central portion between the first and second end portions, the pin or the socket of the plug extends from the central portion to the first end portion of the body, the plug comprises a tab extending from the central portion of the body to the second end portion of the body, and the tab widens from the central portion of the body toward the second end portion of the body.

14. The method of claim 13, wherein the plug or the connector that comprises the first and second slots further comprises first and second openings in communication with the first and second slots, respectively, and that each extend to an outer surface of the body of the plug or the connector, and the method further comprises inserting first and second prongs of a tool into the first and second openings to manipulate the first and second latches and concurrently urging the plug and the connector away from one another to unlock the plug and the connector.

15. The method of claim 13, further comprising applying a LOTO indicator to the tab of the plug after the urging step.

* * * * *